(12) United States Patent
Park

(10) Patent No.: US 6,480,438 B1
(45) Date of Patent: Nov. 12, 2002

(54) PROVIDING EQUAL CELL PROGRAMMING CONDITIONS ACROSS A LARGE AND HIGH DENSITY ARRAY OF PHASE-CHANGE MEMORY CELLS

(75) Inventor: Eungjoon Park, Fremont, CA (US)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 09/881,439

(22) Filed: Jun. 12, 2001

(51) Int. Cl.$^7$ ................................................ G11C 8/00
(52) U.S. Cl. .................. 365/230.06; 365/148; 365/100
(58) Field of Search ................................. 365/148, 100, 365/105, 230.06, 243

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,529,896 A * | 7/1985 | Grandguillot et al. ...... 327/142 |
| 6,085,341 A | 7/2000 | Greason et al. |
| 6,141,241 A | 10/2000 | Ovshinsky et al. |
| 2001/0047449 A1 * | 11/2001 | Wada .......................... 365/191 |

\* cited by examiner

*Primary Examiner*—David Nelms
*Assistant Examiner*—Thong Le
(74) *Attorney, Agent, or Firm*—Trop, Pruner & Hu, P.C.

(57) ABSTRACT

To provide equal cell programming conditions, the integrated circuit device has a number of bitline compensation elements each coupled in series with a separate bitline, and a number of wordline compensation elements each coupled in series with a separate wordline. The resistances in these compensation elements are such that a variation in a sum of (1) the resistance along the corresponding bitline of a cell between the first terminal of the cell and a far terminal of the bitline compensation element that is coupled to the corresponding bitline and (2) the resistance along the corresponding wordline of the cell between a second terminal of the cell and a far terminal of the wordline compensation element that is coupled to the corresponding wordline, is minimized across the cells of the array.

15 Claims, 4 Drawing Sheets

PROVIDING EQUAL CELL PROGRAMMING CONDITIONS ACROSS A LARGE AND HIGH DENSITY ARRAY OF PHASE-CHANGE MEMORY CELLS

BACKGROUND

This invention is generally related to programming an array of phase-change memory cells in an integrated circuit device, and is more particularly related to providing equal cell programming conditions for greater uniformity across the array.

Solid state memory devices that use a structural phase-change material as the data storage mechanism (referred to here simply as 'phase-change memories') offer significant advantages in both cost and performance over conventional charge storage based memories. In such devices, a phase-change memory array is formed with a number of vertically oriented conductive lines, sometimes called bitlines, and a number of horizontally oriented conductive lines, sometimes called wordlines, arranged in a cross-point matrix. The matrix allows each crossing of a bitline-wordline pair to be associated with a separate memory cell formed nearby in a substrate of the device. To obtain low manufacturing costs in large volumes, every memory cell in the array may be designed to have the same structure. Thus, the cells may be described using only one representative cell, where it is clear that the following description may be applicable to all other cells in the array.

The cell has a small volume of structural phase-change material to store the cell's data. This material may be, for instance, a chalcogenide alloy that exhibits a reversible structural phase-change from amorphous to crystalline. The volume of the phase-change material acts as a programmable resistor and changes from one resistivity state to another, corresponding to a change from one type of structure to another, when the cell has been programmed. The small volume of the material is integrated into a circuit in the cell, perhaps in series with a fixed value matching resistor and an active device such as a transistor switch or a parasitic diode. Such a circuit allows the cell to act as a fast switching programmable resistor. A first terminal of the cell is coupled to the vertically oriented bitline and a second terminal is coupled to the horizontally oriented wordline of the cell's corresponding bitline-wordline pair. The cell is programmed into the desired state by applying a programming pulse to the corresponding bitline-wordline pair, so as to induce a pulse, having a desired voltage, across the cell.

To help reduce manufacturing and operating costs of the array, the same programming pulse may be applied directly to the corresponding bitline-wordline pair of each constituent cell, when seeking to program that cell into the desired state. However, this technique can possibly lead to programming errors in an array that has a large number and greater density of memory cells, because there is a significant amount of variation in cell voltage across such arrays, even though the same programming pulse is applied to the bitline-wordline pairs of replicate cells in the array.

BRIEF DESCRIPTION OF THE DRAWINGS

The invention is illustrated by way of example and not by way of limitation in the figures of the accompanying drawings in which like references indicate similar elements. It should be noted that references to"an" embodiment in this disclosure are not necessarily to the same embodiment, and they mean at least one.

DETAILED DESCRIPTION

An integrated circuit device is described having a number of bitlines and wordlines, and a number of memory cells each of which has a structural phase-change material to store the cell's data. Each cell is coupled between a corresponding bitline-wordline pair. Techniques are described for reducing the variation in cell voltage across the cells of the array as a programming pulse is applied to each bitline-wordline pair. The reduction in the variation of cell voltage helps obtain more uniform programming conditions which lead to a greater likelihood of error free programming of the memory array.

Figure 1:
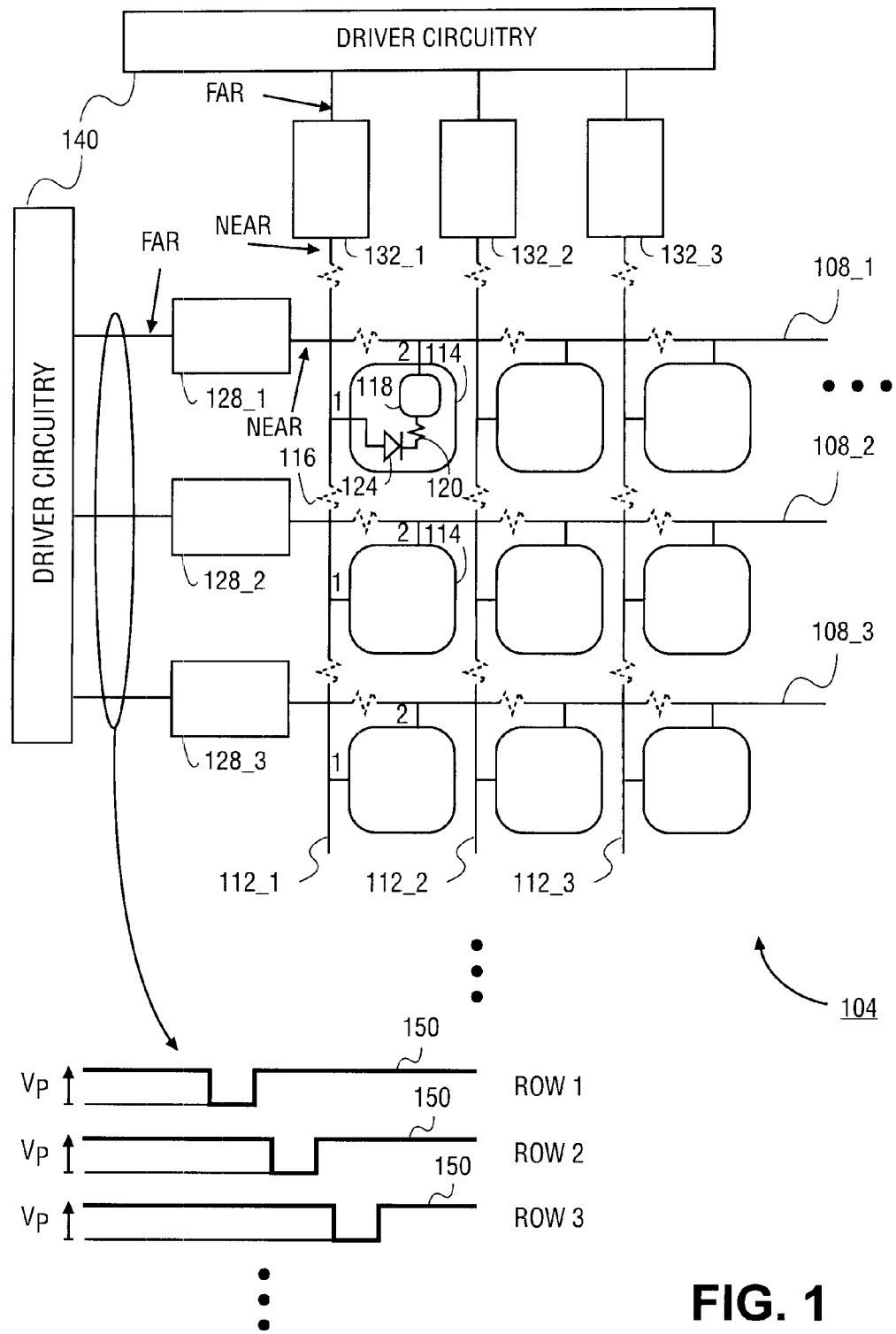
FIG. 1 shows a circuit schematic of part of an integrated circuit device having a phase-change memory array in which the variation in cell voltage has been reduced.

Referring now to FIG. 1, what's shown is a circuit schematic of part of an integrated circuit device 104 having a phase-change memory array in which the variation in cell voltage during programming has been reduced. The array has a number of vertically oriented conductive lines 112_1, 112_2, . . . (referred to here as bitlines) and a number of horizontally oriented conductive lines 108_1, 108_2, . . . (called wordlines) arranged in a cross-point matrix as shown. This matrix arrangement allows each crossing of a bitline-wordline pair to be associated with a separate memory cell 114 formed nearby within a substrate of the integrated circuit device 104. To obtain low manufacturing costs in large volumes, every cell 114 in the array may be designed to have the same structure. Thus, the cells are now described using only a representative cell, where it is clear that the following description applies to all other cells in the array.

The cell 114 has a small volume of structural phase-change material 118 that is coupled in series with a diode structure 124 and a matching resistor 120. The volume of phase-change material 118 acts as a programmable resistor and changes from one resistivity state to another, corresponding to a change from one type of structure to another, when an appropriately sized pulse of current has passed through it. The series coupled components in the cell 114 can be accessed through terminals 1 and 2 of the cell 114, where the first terminal is coupled to a bitline 112 while the second terminal is coupled to a wordline 108 which form the corresponding bitline-wordline pair for this cell.

To reduce the variation in cell voltage across the memory cells as a programming pulse is applied to each bitline-wordline pair, the integrated circuit device 104 is equipped with a number of bitline compensation elements 132_1, 132_2 . . . each being coupled in series with a separate one of the bitlines 112. In addition, the device 104 has a number of wordline compensation elements 128_1, 128_2 . . . each being coupled in series with a separate one of the wordlines 108. Each of these compensation elements has a resistance that together are designed to minimize the variation in cell voltage across the array. This technique overcomes the large variation in resistance that is exhibited between bitline-wordline pairs that are located far from each other in the array. To help illustrate this, FIG. 1 shows the distributed resistance of the bitlines and wordlines as resistor symbols in dotted lines. An equivalent resistance 116 in dotted lines is drawn between each adjacent pair of cell terminal connections to a wordline or bitline to represent this distributed resistance.

The bitline and wordline compensation elements 132, 128 have resistances such that a sum of (1) the resistance along the corresponding bitline 112 of a cell 114 between a first terminal of the cell 114 and a far terminal of the bitline compensation element 132 that is coupled to the corresponding bitline 112 and (2) the resistance along the corresponding wordline 108 of the cell 114 between a second terminal of the cell 114 and a far terminal of the wordline compensation element 128 that is coupled to the corresponding wordline 108, is essentially equal for each of the memory cells. This is an ideal situation which may not be met in practice, such that rather than having that sum be essentially equal, it may be more practical to have variation in that sum be minimized across the cells of the array. In this way, variation in cell voltage across the cells may be reduced when the same programming voltage pulse 150 (having a magnitude $V_p$) as shown is applied to each bitline-wordline pair by driver circuitry 140. More specifically, the same voltage pulse 150 can be applied directly to the far terminal of each wordline compensation element 128 while at the same time being able to minimize the variation in cell voltage across terminals 1 and 2 of each cell 114 in the array. This occurs because the total resistance between the far terminal of the wordline compensation element 128 and the far terminal of the corresponding bitline compensation element 132 is designed to be the same, for each memory cell that is accessed by a corresponding bitline-wordline pair.

Figure 2:
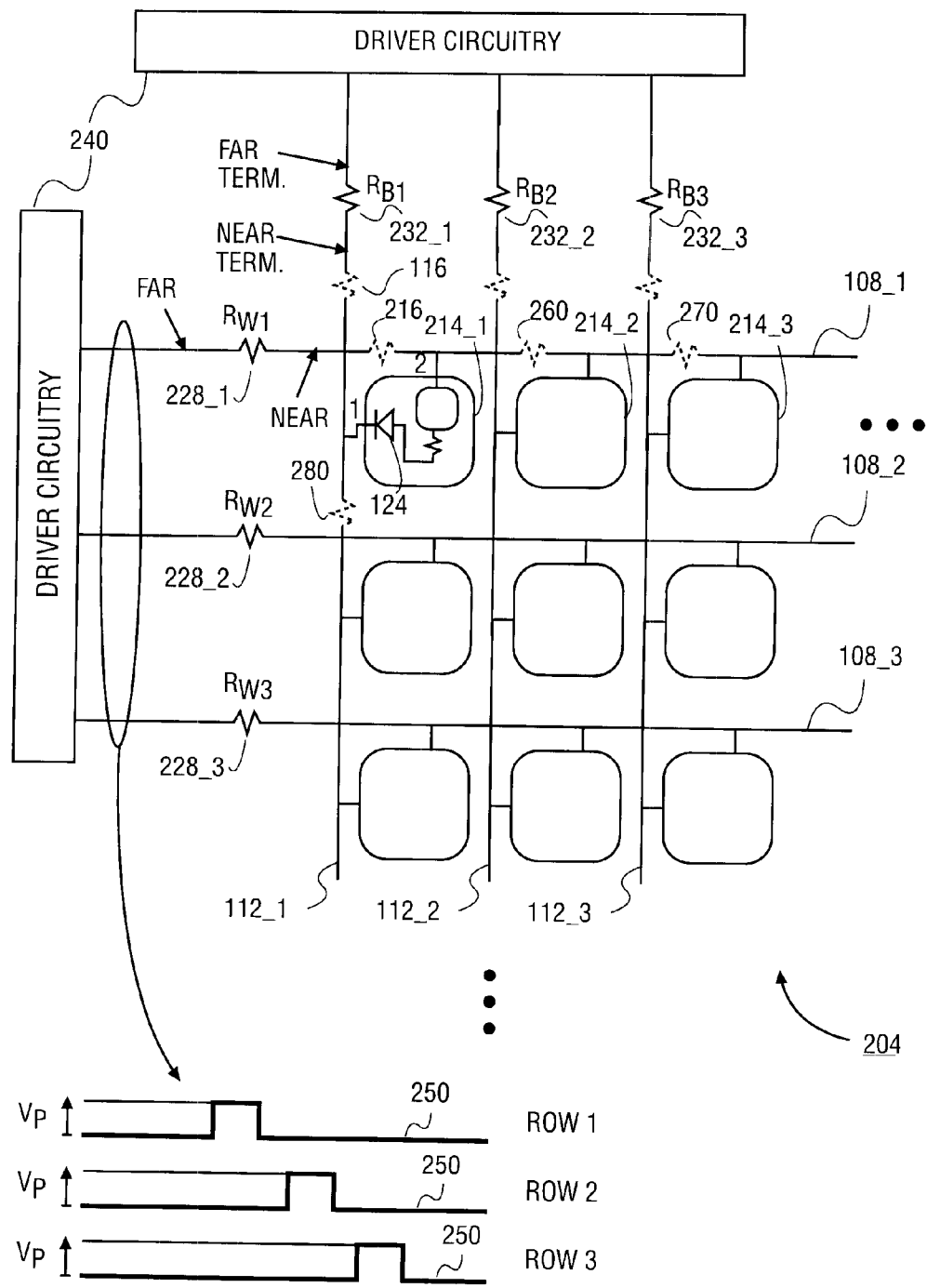
FIG. 2 illustrates a circuit schematic of an integrated circuit device featuring a phase-change memory array in which lumped resistors are used to help reduce the variation in cell voltage across the array.

Referring now to FIG. 2, what is shown is a circuit schematic of an alternative embodiment of the cell voltage variation reduction technique, as part of an integrated circuit device 204. This device 204 features driver circuitry 240 which directly drives the same programming voltage pulse 250 on each wordline 108, where in this embodiment the pulse 250 is 'active high' rather than active low as in the pulse 150. That is because in this embodiment, the diode structure 124 in each memory cell 214 has been reversed, so that its forward current is now directed in the opposite direction than in the cell 114 of FIG. 1.

FIG. 2 also shows an embodiment in which each bitline compensation element is a lumped, passive resistor 232, and each wordline compensation element is a lumped, passive resistor 228. This mechanism for cell voltage variation reduction is similar to the more general version in FIG. 1 in that the sum of (1) the resistance along a corresponding bitline 112 of a cell 214 between a first terminal of the cell 214 and a far terminal of the lumped resistor 232 that is coupled to the corresponding bitline 112 (where this resistance includes the equivalent resistance 116 in the bitline 112 plus the resistance of the lumped element resistor 232) and (2) the resistance along the corresponding wordline 108 of the cell 214 between a second terminal of the cell 214 and a far terminal of the lumped resistor 228 that is coupled to the corresponding wordline 108 (where this resistance includes the equivalent resistance 216 plus the resistance of the lumped resistor 228), is essentially equal or its variation is minimized for each of the cells. Application of such a technique may result in the following resistance distribution for the lumped resistors:

lumped resistors 232: $R_{B1} > R_{B2} > R_{B3} \ldots$ lumped resistors 228: $R_{W1} > R_{W2} > R_{W3} \ldots$ In the embodiment shown in FIG. 2, the difference in resistance between adjacent lumped resistors 232 that are coupled to the bitlines 112 is essentially the resistance between a second terminal of a memory cell 214 that is coupled to the selected bitline-wordline pair and a second terminal of a memory cell coupled to the immediately adjacent bitline-wordline pair along the selected wordline. For instance, considering adjacent memory cells 214_1 and 214_2 in FIG. 2, the difference in resistance between lumped resistors 232_1 ($R_{B1}$) and 232_2 ($R_{B2}$) would be the equivalent resistance 260, where $R_{B1}$ is larger than $R_{B2}$ by an amount essentially equal to the equivalent resistance 260. Similarly, $R_{B2}$ is larger than $R_{B3}$ by the equivalent resistance 270, and so on. The same type of relationship holds for adjacent lumped resistors 228_1 and 228_2 for which $R_{W1}$ is greater than $R_{W2}$ by an amount essentially equal to the equivalent resistance 280.

Figure 3:
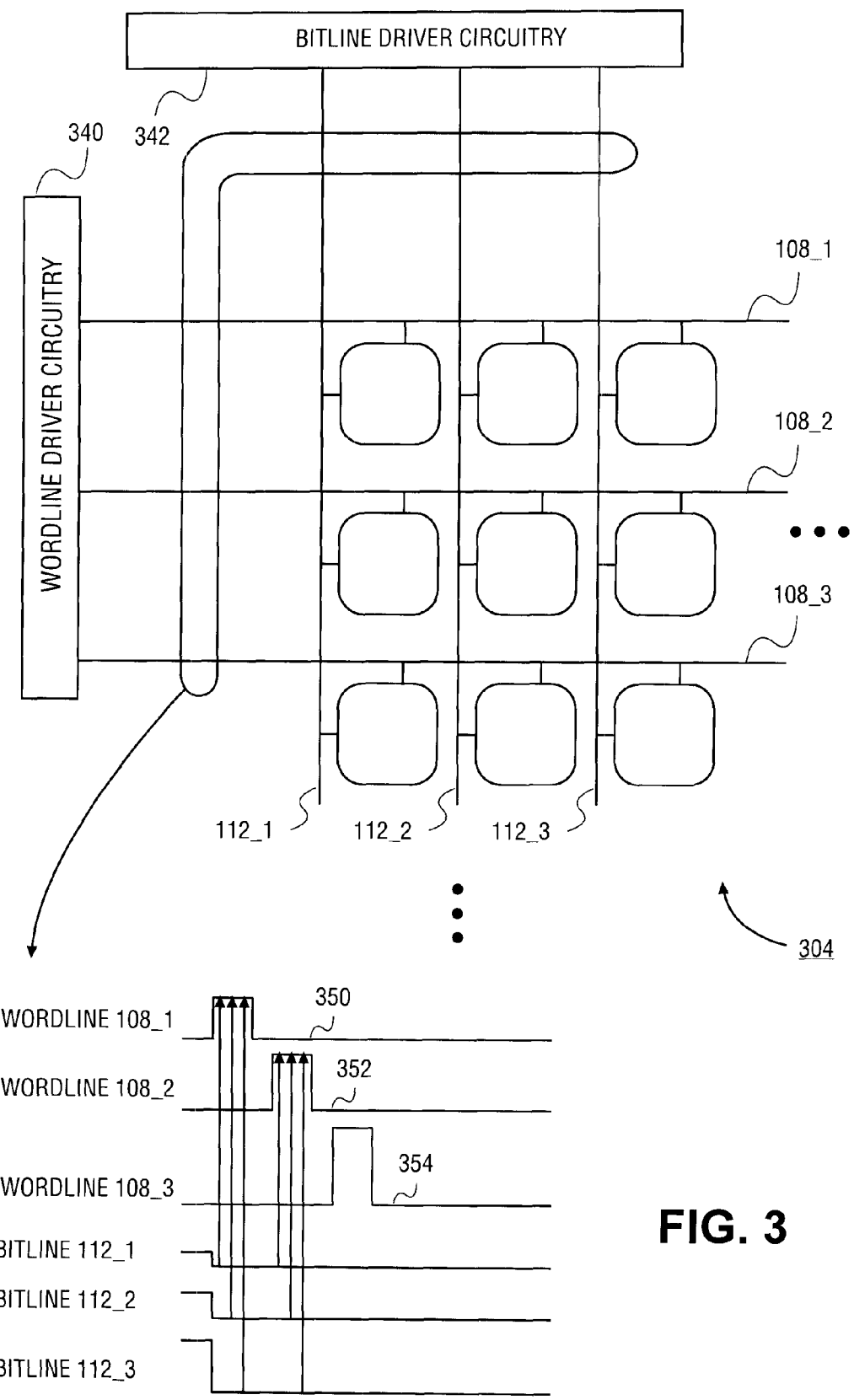
FIG. 3 depicts a circuit schematic of an integrated circuit device featuring a phase-change memory array, wherein driver strength varies as a function of the bitline or wordline being driven.

Turning now to FIG. 3, what is shown is another embodiment of the cell voltage variation reduction technique in an integrated circuit device 304 in which wordline driver circuitry 340 cooperates with bitline driver circuitry 342 to provide not the same programming voltage pulse but rather a variable strength (voltage) programming pulse. The magnitude of the pulse varies as a function of the bitline-wordline pair to which the pulse is being applied so as to compensate for the buildup of distributed resistance in the array. The strength or maximum voltage of the programming pulse is greater if the bitline-wordline pair to which the pulse is being applied is located further from the driver circuitry. This is depicted by the voltage pulses 350, 352, and 354 which are applied to wordlines 108_1, 108_2, and 108_3, respectively, and their corresponding bitline voltages. Note how the bitline-wordline voltage is steadily increasing as a function of the bitline's increasing distance from the wordline driver circuitry 340.

Figure 4:
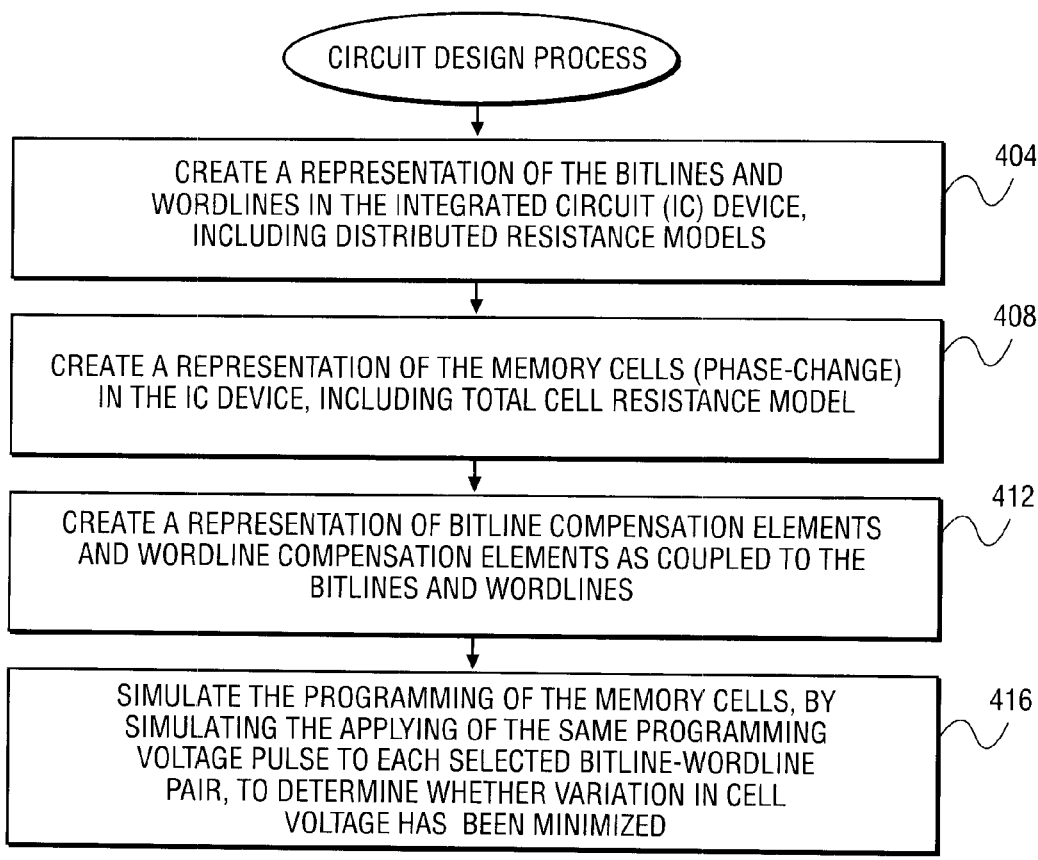
FIG. 4 depicts a flow diagram of a process for designing the integrated circuit device having a phase-change memory array with reduced cell voltage variation.

FIG. 4 shows a flow diagram of operations for designing an integrated circuit device in which the variation in cell voltage (across a phase-change memory array) during programming can be minimized. The process begins with the creation of a representation of a number of bitlines and wordlines that are to be built into the device to form the memory array (operation 404). This representation may be created using a computer aided design system for designing and simulating electronic devices. Each bitline and wordline is assigned equivalent resistances that may be based on a common distributed resistance model of a conductive line. The process also includes creating a representation of a number of memory cells that form the array and are built into the integrated circuit. Each cell is to have a structural phase-change material to store the cells' data, and to be coupled between a corresponding bitline-wordline pair, with a given total cell resistance (operation 408). A representation of a number of bitline compensation elements and wordline compensation elements as described above is created, where these elements are to be built into the integrated circuit such that each element is coupled in series with a separate one of the bitlines and each wordline element is to be coupled in series with a separate one of the wordlines (operation 412). As described above, these compensation elements may include various circuit elements, including for instance a single lumped resistor, with resistances selected so that variation in the following sum resistance is minimized for each of the memory cells:

[the resistance along a corresponding bitline of a cell, between a first terminal of the cell and a far terminal of the bitline compensation element that is coupled to the corresponding bitline]+[the resistance along a corresponding wordline of the cell, between a second terminal of the cell and a far terminal of the wordline compensation element that is coupled to the corresponding wordline]

The resistance of a bitline compensation element of each selected bitline-wordline pair is selected to be smaller than a resistance of the compensation element of an immediately adjacent bitline-wordline pair, and wherein this resistance is smaller by an amount essentially equal to the resistance between a terminal of a memory cell coupled to the selected bitline-wordline pair and a second terminal of another memory cell coupled to an immediately adjacent bitline-wordline pair, along the selected wordline. The same type of continuously decreasing resistances can be provided for the wordline compensation elements.

Next, the programming of the array is simulated, by representing the application of the same voltage pulse to each bitline-wordline pair (via the corresponding compensation elements), to determine whether the variation in cell voltage has been minimized across the cells of the array. (operation 416). This would include creating a representation of the driver circuitry (see e.g. FIGS. 1–3) such that the driver circuitry is coupled to apply to each bitline-wordline pair a programming pulse having the same voltage magnitude.

In the various embodiments described above, what has not been specifically described are conventional circuitry that may be required for accessing the phase-change memory array, including decoding logic that translates address information and data information into the appropriate pulses that are applied to the selected bitline-wordline pairs. In addition, although the above description may refer to a single cell being programmed, the concepts are also applicable to simultaneously program a number of cells.

To summarize, various embodiments of a technique for providing equal cell programming conditions across a large and high density array of phase-change memory cells have been described. It will, however, be evident that various modifications and changes may be made thereto without departing from the broader spirit and scope of the invention as set forth in the appended claims. For instance, as an alternative to a single lumped, passive resistor, the compensation elements may include active devices which are designed to operate in such a manner that the variation in total resistance that is presented to driver circuitry across each bitline-wordline pair is minimized. The specification and drawings are, accordingly, to be regarded in an illustrative rather than a restrictive sense.

What is claimed is:

1. An integrated circuit device comprising:
   a plurality of bitlines and a plurality of wordlines;
   a plurality of memory cells each of which has a structural phase-change material to store data and is coupled between a corresponding bitline-wordline pair of the bitlines and wordlines; and
   a plurality of bitline compensation elements each being coupled in series with a separate one of the bitlines, and a plurality of wordline compensation elements each being coupled in series with a separate one of the wordlines, said bitline and wordline compensation elements having resistances such that a variation in a sum of (1) the resistance along the corresponding bitline of a cell between a first terminal of the cell and a far terminal of the bitline compensation element that is coupled to the corresponding bitline and (2) the resistance along the corresponding wordline of the cell between a second terminal of the cell and a far terminal of the wordline compensation element that is coupled to the corresponding wordline, is minimized across the memory cells.

2. The integrated circuit device of claim 1 wherein each of the plurality of bitline compensation elements and the plurality of wordline compensation elements is a lumped passive resistor.

3. The integrated circuit device of claim 2 further comprising:
   driver circuitry coupled to apply to each bitline-wordline pair, of the plurality of bitlines and the plurality of wordlines, the same programming pulse, through the lumped resistors that are coupled to the bitline-wordline pair.

4. The integrated circuit device of claim 2 wherein a resistance of the bitline compensation element of each selected bitline-wordline pair is smaller than a resistance of the bitline compensation element of an immediately adjacent bitline-wordline pair.

5. The integrated circuit device of claim 4 wherein said resistance is smaller by essentially a resistance between a second terminal of a memory cell coupled to the selected bitline-wordline pair and a second terminal of a memory cell coupled to the immediately adjacent bitline-wordline pair, along the selected wordline.

6. An integrated circuit device comprising:
   a plurality of bitlines and a plurality of wordlines;
   a plurality of memory cells each of which has a structural phase-change material to store data and being coupled between a corresponding bitline-wordline pair of the plurality of bitlines and the plurality of wordlines; and
   means for reducing variation in cell voltage across the plurality of memory cells as a programming pulse is applied to each bitline-wordline pair of the plurality of bitlines and wordlines.

7. The integrated circuit device of claim 6 wherein said cell voltage variation reduction means includes a plurality of first lumped resistors each being coupled in series with a separate one of the plurality of bitlines, and a plurality of second lumped resistors each being coupled in series with a separate one of the plurality of wordlines, said plurality of first and second lumped resistors having resistances such that the variation in a sum of (1) the resistance along the corresponding bitline of a cell between a first terminal of the cell and a far terminal of the first lumped resistor that is coupled to the corresponding bitline and (2) the resistance along the corresponding wordline of the cell between a second terminal of the cell and a far terminal of the second lumped resistor that is coupled to the corresponding wordline, is minimized across the plurality of memory cells.

8. The integrated circuit device of claim 7 further comprising:
   driver circuitry coupled to apply to each bitline-wordline pair, of the plurality of bitlines and the plurality of wordlines, the same programming pulse, through the first lumped resistor and the second lumped resistor that are coupled to the selected bitline-wordline pair, respectively.

9. The integrated circuit device of claim 6 further comprising:
   driver circuitry coupled to apply to each bitline-wordline pair, of the plurality of bitlines and the plurality of wordlines, a programming pulse, and wherein said cell voltage reduction means is to cause a strength of the programming pulse to vary as a function of the bitline-wordline pair to which the pulse is applied.

10. The integrated circuit device of claim 9 wherein the strength of the programming pulse is greater if the bitline-wordline pair to which the pulse is applied is located further from the driver circuitry.

11. A method for designing an integrated circuit, comprising:

creating a representation of a plurality of bitlines and a plurality of wordlines to be built into the integrated circuit;

creating a representation of a plurality of memory cells to be built into the integrated circuit, each cell to have a structural phase-change material to store data and to be coupled between a corresponding bitline-wordline pair of the plurality of bitlines and the plurality of wordlines; and creating a representation of a plurality of bitline compensation elements and a plurality of wordline compensation elements to be built into the integrated circuit, each bitline compensation element to be coupled in series with a separate one of the plurality of bitlines, and each wordline compensation element to be coupled in series with a separate one of the plurality of wordlines, said plurality of bitline and wordline compensation elements having resistances selected so that the variation in a sum of (1) the resistance along the corresponding bitline of a cell between a first terminal of the cell and a far terminal of the bitline compensation element that is coupled to the corresponding bitline and (2) the resistance along the corresponding wordline of the cell between a second terminal of the cell and a far terminal of the wordline compensation element that is coupled to the corresponding wordline, is minimized across the plurality of memory cells.

12. The method of claim 11 wherein each of the plurality of bitline compensation elements and the plurality of wordline compensation elements is a lumped passive resistor.

13. The method of claim 12 further comprising:

creating a representation of driver circuitry that is coupled to apply to each bitline-wordline pair, of the plurality of bitlines and the plurality of wordlines, the same programming pulse, through the lumped resistors that are coupled to the bitline-wordline pair.

14. The method of claim 11 wherein a resistance of the bitline compensation element of each selected bitline-wordline pair is smaller than a resistance of the bitline compensation element of an immediately adjacent bitline-wordline pair.

15. The method of claim 11 wherein said resistance is smaller by an amount essentially equal to a resistance between a second terminal of a memory cell coupled to the selected bitline-wordline pair and a second terminal of a memory cell coupled to the immediately adjacent bitline-wordline pair, along the selected wordline.

* * * * *